United States Patent
Zhou et al.

(10) Patent No.: US 8,385,873 B2
(45) Date of Patent: Feb. 26, 2013

(54) EQUIVALENT RADIO FREQUENCY NOTCH FILTER, RADIO FREQUENCY CHIP, AND RECEIVER

(75) Inventors: Jianjun Zhou, Shenzhen (CN); Zhuobiao He, Shenzhen (CN); Fan Yang, Shenzhen (CN); Yusong Chi, Shenzhen (CN); Meng Wang, Shenzhen (CN); Hongyu Wang, Shenzhen (CN); Xinfang Liu, Shenzhen (CN); Min Yi, Shenzhen (CN); Xinrong Hu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 117 days.

(21) Appl. No.: 13/118,270

(22) Filed: May 27, 2011

(65) Prior Publication Data
US 2011/0230157 A1  Sep. 22, 2011

Related U.S. Application Data

(63) Continuation of application No. PCT/CN2009/075022, filed on Nov. 18, 2009.

(30) Foreign Application Priority Data

Nov. 27, 2008  (CN) .......................... 2008 1 0227625

(51) Int. Cl.
*H04B 1/16* (2006.01)
(52) U.S. Cl. ........................ 455/296; 455/307
(58) Field of Classification Search .................. 455/130, 455/200.1, 226.1, 230, 231, 254, 259, 266, 455/296, 306, 307, 310, 311
See application file for complete search history.

(56) References Cited

U.S. PATENT DOCUMENTS

| | | | |
|---|---|---|---|
| 4,267,605 A | | 5/1981 | Matsuzawa et al. |
| 5,303,404 A | * | 4/1994 | Kivela ........................... 455/266 |
| 6,389,273 B1 | * | 5/2002 | Brandenburg ................ 455/296 |
| 6,678,340 B1 | | 1/2004 | Khlat et al. |
| 7,362,384 B2 | | 4/2008 | Dauphinee et al. |
| 7,756,500 B1 | * | 7/2010 | Fulga et al. ................... 455/266 |
| 2008/0240315 A1 | | 10/2008 | De Mey et al. |

FOREIGN PATENT DOCUMENTS

| | | |
|---|---|---|
| CN | 1358348 A | 7/2002 |
| CN | 1635717 A | 7/2005 |
| CN | 1661929 A | 8/2005 |
| CN | 101136887 A | 3/2008 |
| CN | 101436869 A | 5/2009 |

(Continued)

OTHER PUBLICATIONS

Written Opinion issued in corresponding PCT application No. PCT/CN2009/075022, dated May 27, 2011, total 5 pages.

(Continued)

*Primary Examiner* — Thanh Le
(74) *Attorney, Agent, or Firm* — Conley Rose, P.C.; Grant Rodolph; Nicholas K. Beaulieu

(57) ABSTRACT

An equivalent radio frequency (RF) notch filter, an RF chip, and a receiver are provided. The equivalent RF notch filter includes: a local oscillation (LO) circuit, configured to provide a LO frequency signal; configured to be connected in parallel with the main chain, and down-convert signals of the main chain; and a frequency selective circuit realized by impedance difference, configured to provide different impedances for down-converted signals with different frequencies from the mixing circuit, so as to absorb the signals that need to be suppressed.

20 Claims, 8 Drawing Sheets

FOREIGN PATENT DOCUMENTS

| | | |
|---|---|---|
| EP | 1976129 A1 | 10/2008 |
| KR | 20070065787 A | 6/2007 |

OTHER PUBLICATIONS

Vladimir Aparin, "A New Method of TX Leakage Cancelation in W/CDMA and GPS Receives," 2008 IEEE Radio Frequency Integrated Circuits Symposium, pp. 87-90.

Aparin, "A New Method of TX Leakage Cancelation in W/CDMA and GPS Receivers," IEEE Radio Frequency Integrated Circuits Symposium, Atlanta, GA, RFIC 2008, pp. 87-90.

International Search Report for International application No. PCT/CN2009/075022, mailed Feb. 4, 2010, 4 pages total.

* cited by examiner

EQUIVALENT RADIO FREQUENCY NOTCH FILTER, RADIO FREQUENCY CHIP, AND RECEIVER

CROSS-REFERENCE TO RELATED APPLICATION

This application is a continuation of International Application No. PCT/CN2009/075022, filed on Nov. 18, 2009, which claims priority to Chinese Patent Application No. 200810227625.6, filed on Nov. 27, 2008, both of which are hereby incorporated by reference in their entireties.

FIELD OF THE TECHNOLOGY

The present invention relates to the field of wireless communication technologies, and more particularly to an equivalent radio frequency (RF) notch filter, an RF chip, and a receiver.

BACKGROUND OF THE INVENTION

In wireless communication systems and terminal equipment, receivers always suffer various interferences of transmit signal leakage from outside and inside, and the interferences have the following influences on duplexers or receiving filters.

First, in a frequency duplexer division (FDD) system, the possibility of out-band interference and transmit signal leakage poses high requirements on the out-band suppression of the duplexer or receiving filter. However, some performance, such as out-band suppression, is always increased at the cost of reducing in-band insertion loss and increasing volume and cost of components. When the out-band suppression of the duplexer or the filter is not high enough, the strong interferences have influence on the linearity of the receiver. For example, in a FDD mobile terminal system having a zero intermediate frequency (ZIF) or very low intermediate frequency (VLIF) architecture, the transmit signal after limited isolation performed by the duplexer will leak into the receiver, such strong transmitter leakage signal increases the requirements on receiver IP2/IP3 greatly, and as a result, in many cases, the receiver needs to add a surface acoustic wave (SAW) filter between the LNA and the mixer to filter out the transmitter leakage, so as to reduce the linearity requirements on the post mixer circuit.

In a first prior art, a method of canceling transmitter leakage by using an anti-phase transmit signal in a duplexer is set forth to improve the suppression of the duplexer on the transmitter leakage. FIG. 1 is a schematic structural view of a duplexer in the prior art. As shown in FIG. 1, according to the solution, coupling of a transmit signal is directly realized in the duplexer, and then the transmit signal is coupled to a receiving port after attenuation and phase shift, such that the transmit signal of the coupling path and the transmitter leakage signal of the main path have the identical amplitudes and reverse phases, and thus the transmit (TX) leakage signal is cancelled, thereby improving the suppression of the duplexer on the TX.

In the first prior art, besides the duplexer, two couplers, one phase shifter, and even one attenuator needs to be added, the components cannot be produced by using the same producing process, and have low integration and high cost. Moreover, the solution has strict requirements on the phase flatness and amplitude flatness of the receiving filter at the transmission frequency band, thus further limiting the actual application scope. Furthermore, the solution can only improve the suppression of the transmitter leakage, but has no effect on other out-band interferences and interferences close to the signal frequencies.

In a second prior art, a method of filtering out out-band interference or part of transmitter leakage by a receiver with an on-chip notch filter or a band-pass filter is set forth. FIG. 2 is a schematic structural view of a "notch filter" in the prior art. As shown in FIG. 2, according to the solution, an RF notch filter is introduced at a cascode stage of a low noise amplifier (LNA) or behind the LNA. According to the solution, for the frequency band with a narrow interval between transmitting and receiving, such as, WCDMA BAND II, the notch filter has limited attenuation on the transmission, which is always no higher than 5 dB, and thus the suppression is very limited. As for out-band interference with a frequency close to the frequency of the received signal, the notch filter substantially has no effect. The notch filter needs to introduce an active circuit part for improving a Q value, but the active circuit will increase the noise of the receiver.

In a third prior art, a method of canceling interference signals or transmitter leakage signals by the receiver with a TX cancellation feedback circuit. FIG. 3 is a schematic structural view of a "TX leakage cancellation" in the prior art. As shown in FIG. 3, according to the solution, at a certain RF node in an RF chip (IC), for example, a node D, a suitable local oscillator (LO) is used, and a MIXI1 and a MIXQ1 down-convert RX(receive) main signals and interference or transmitter leakage signals, a low-pass filter (LPF) selects the interference or transmitter leakage signals after down conversion, and filters out the RX signals, and then a MIXI2 and a MIXQ2 up-converts the interference or transmit signals after being filtered by the LPF, and sends the up-convert result to the same RF node or an input of a component in front of the node thereof through negative feedback, and as shown in FIG. 3, to a SUM2, so as to realize interference cancellation or cancellation of the transmitter leakage signals.

However, according to the solution, a double of frequency mixing is required, the circuit is complex, and the driving load of the LO is heavy. Furthermore, the loop gain of the TX cancellation circuit cannot be high, otherwise large signals are likely saturated, and the cancellation effect is limited. Moreover, the linearity and noise of the cancellation circuit has great noise influence on the receiver.

SUMMARY OF THE INVENTION

Accordingly, embodiments of the present invention provide an equivalent RF notch filter, an RF chip, and a receiver, so as to improve the capability of filtering out frequency signals that need to be suppressed in implementation of RF narrowband filter.

In an embodiment of the present invention, an equivalent RF notch filter is configured to absorb signals of a main chain of the RF circuit, and the signals need to be suppressed. The equivalent RF notch filter includes a local oscillation (LO) circuit, a mixing circuit, and a frequency selective circuit realized by impedance difference. The LO circuit is configured to provide a LO frequency signal. An input end of the mixing circuit is electrically connected with the main chain of the RF circuit, and the mixing circuit parallels with the main chain, and is configured to down-convert the signals of the main chain that need to be suppressed according to the LO frequency signal provided by the LO circuit, and output down-converted signals. The frequency selective circuit realized by impedance difference is connected to a baseband output end of the mixing circuit, and is configured to provide different impedances for down-converted signals with different frequencies from the mixing circuit.

In an embodiment of the present invention, an RF chip includes a main chain including at least one LNA and a mixer, and further includes an equivalent RF notch filter. The equivalent RF notch filter includes a LO circuit, a mixing circuit, and a frequency selective circuit realized by impedance difference. The LO circuit is configured to provide a LO frequency signal. An input end of the mixing circuit is electrically connected with the main chain, and the mixing circuit parallels with the main chain, and is configured to down-convert the signals of the main chain that needs to be suppressed according to the LO frequency signal provided by the LO circuit, and output down-converted signals. The frequency selective circuit realized by impedance difference is connected to a baseband output end of the mixing circuit, and is configured to provide different impedances for down-converted signals with different frequencies from the mixing circuit.

In an embodiment of the present invention, a receiver includes an RF chip and a main chain including at least one LNA and a mixer. The RF chip further includes a LO circuit, a mixing circuit, and a frequency selective circuit realized by impedance difference. The LO circuit is configured to provide a LO frequency signal. An input end of the mixing circuit is electrically connected with the main chain of the RF circuit, and the mixing circuit parallels with the main chain, and is configured to down-convert the signals of the main chain that need to be suppressed according to the LO frequency signal provided by the LO circuit, and output down-converted signals. The frequency selective circuit realized by impedance difference is connected to a baseband output end of the mixing circuit, and is configured to provide different impedances for down-converted signals with different frequencies from the mixing circuit.

According to the equivalent RF notch filter, the RF chip, and the receiver of the embodiments of the present invention, through connecting the mixing circuit to the RF chip main chain, the signals in the main chain that need to be suppressed (for example, interference or transmit signal leakage) are introduced into the frequency selective circuit realized by impedance difference through the mixing circuit, thus achieving the purpose of filtering out interference signals of the RF chip. Compared with the prior art, the equivalent RF notch filter of the embodiments has the advantages that lower noise is introduced and the cost is reduced.

DETAILED DESCRIPTION OF THE EMBODIMENTS

Figure 1:
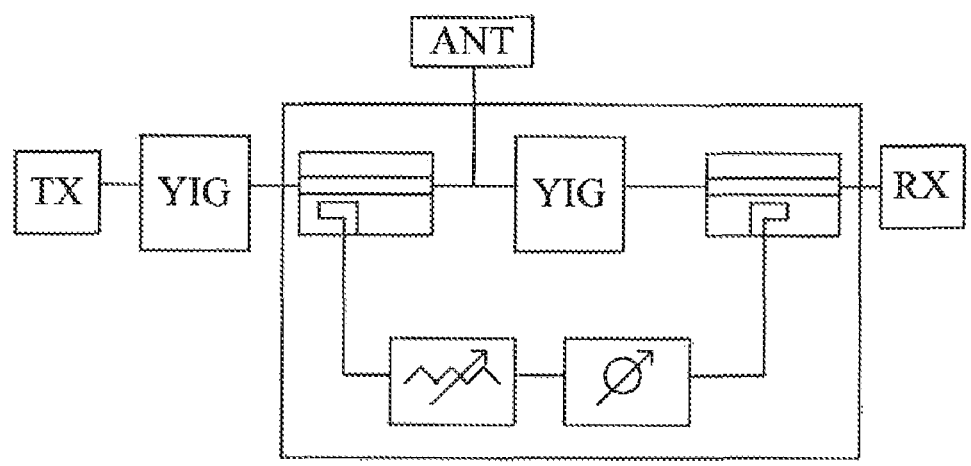
FIG. 1 is a schematic structural view of a duplexer in the prior art.
Figure 2:
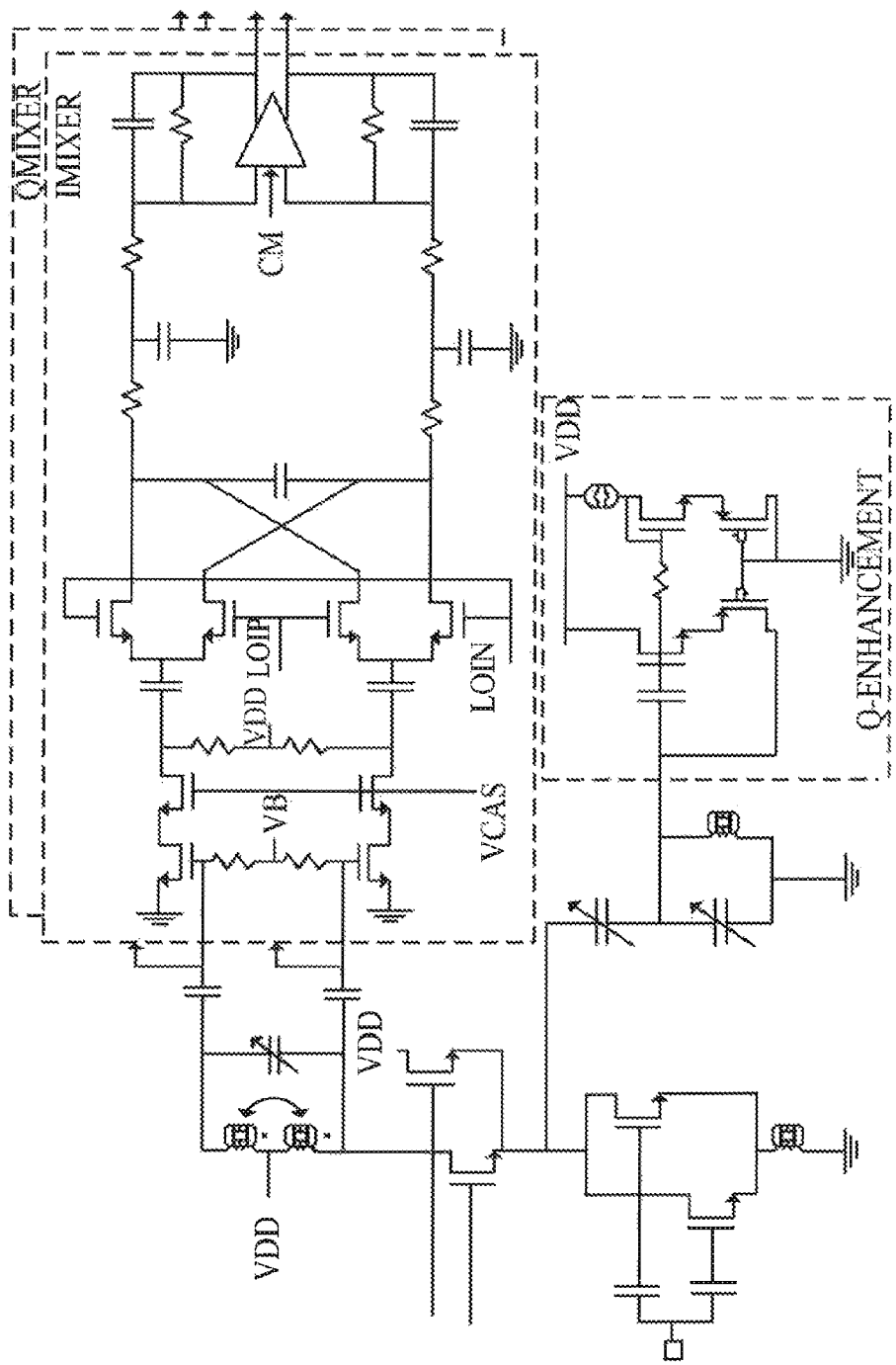
FIG. 2 is a schematic structural view of a "Notch filter" in the prior art.
Figure 3:
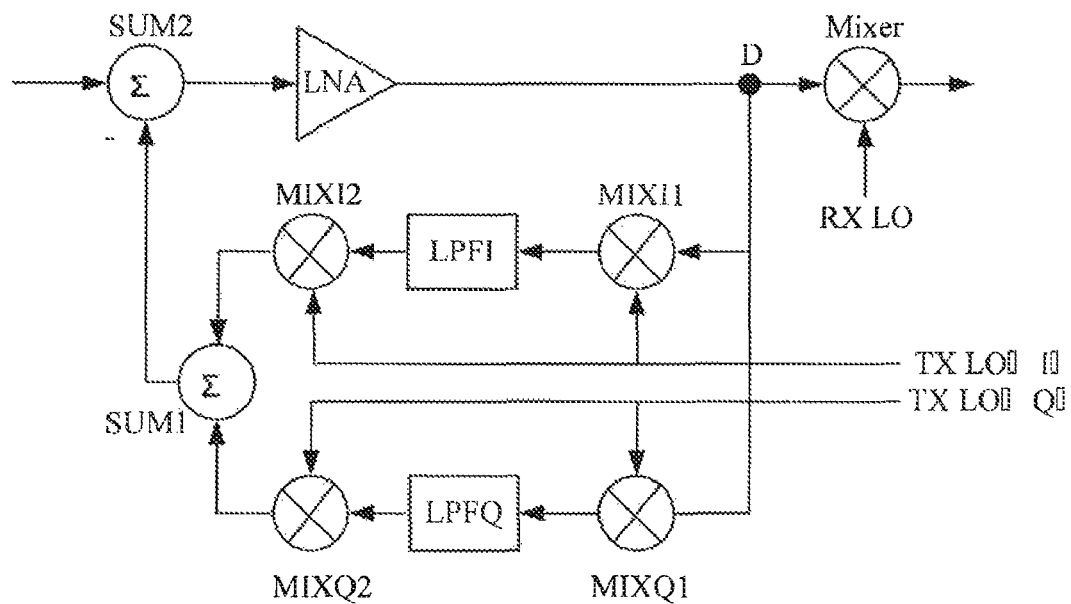
FIG. 3 is a schematic structural view of a "TX leakage cancellation" in the prior art.
Figure 4:
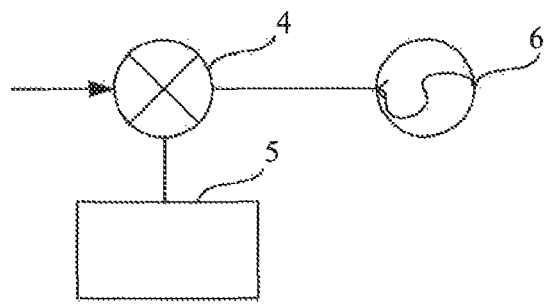
FIG. 4 is a schematic structural view of an equivalent RF notch filter according to an embodiment of the present invention.

FIG. 4 is a schematic structural view of an equivalent RF notch filter according to an embodiment of the present invention. As shown in FIG. 4, the equivalent RF notch filter of this embodiment is connected to a main chain of an RF circuit, such as, an RF chip, and includes a mixing circuit 4, a frequency selective circuit realized by impedance difference 5 connected with the mixing circuit 4, and a local oscillation (LO) circuit 6 connected with the mixing circuit 4. The mixing circuit 4 is configured to down-convert signals of the main chain that need to be suppressed, including in-band and out-band interference or transmitter leakage that need to be suppressed and main receiver frequency bands, according to a LO frequency signal provided by the LO circuit 6, and output down-converted signals to the frequency selective circuit realized by impedance difference 5. The frequency selective circuit realized by impedance difference 5 is configured to provide different impedances for down-converted signals with different frequencies, for example, low impedances for low frequencies, and high impedances for high frequencies. The frequency selective circuit realized by impedance difference 5 receives signals of various frequencies after frequency conversion from the mixing circuit 4. According to the difference between the interference signal frequency and the main signal frequency, the interference signal is down-converted and mapped to a low-impedance region, and the main signal is down-converted and mapped to a high-impedance region. The LO circuit 6 is configured to provide signals with fixed or variable LO frequencies for the mixing circuit 4, in which the provided LO frequencies may be TX LO or other LOs. Through changing the LO frequency of the LO circuit 6 and parameters of the frequency selective network of the frequency selective circuit realized by impedance difference 5, flexible suppression of different frequencies is realized.

Figure 5A:
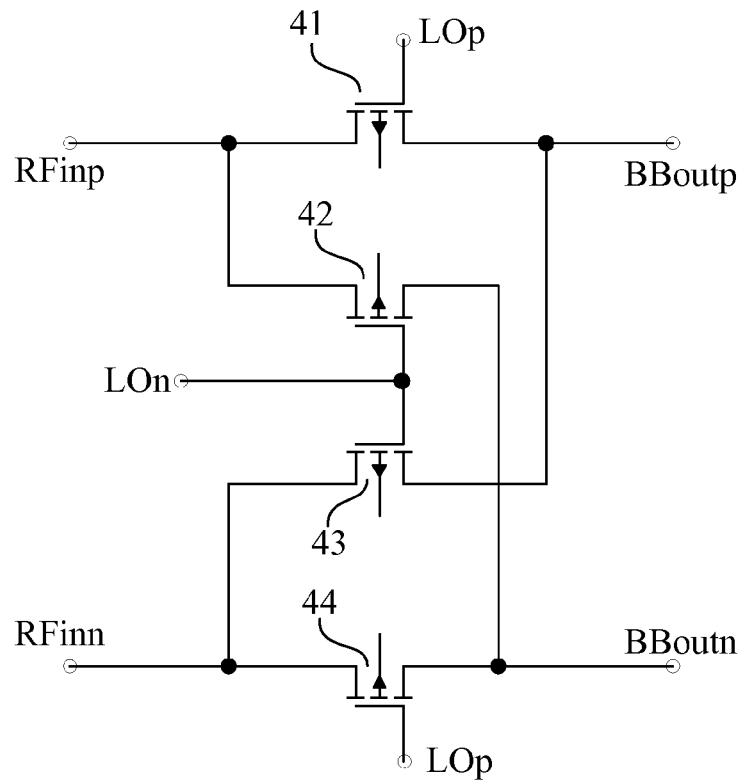
FIG. 5a is a schematic structural view of a differential passive mixing circuit according to an embodiment of the present invention.

FIG. 5a is a schematic structural view of a differential passive mixing circuit according to an embodiment of the present invention. As shown in FIG. 5a, the differential passive mixing circuit of this embodiment includes four MOS field effect transistors. A source of a MOS transistor 41 is connected to a source of a MOS transistor 42 at a connection point being an RF differential input positive end RFinp. A source of a MOS transistor 43 is connected with a source of a MOS transistor 44 at a connection point being an RF differential input negative end RFinn. A drain of the MOS transistor 41 is connected with a drain of the MOS transistor 43 at a connection point being a baseband differential output positive end BBoutp. A drain of the MOS transistor 42 is connected to a drain of the MOS transistor 44 at a connection point being a baseband differential output negative end BBoutn. Gates of the MOS transistor 41 and the MOS transistor 44 are LO input positive ends LOp. A gate of the MOS transistor 42 is connected with a gate of the MOS 43 at a connection point being a LO input negative end LOn. The RF differential input positive end RFinp and the RF differential input negative end RFinn are connected in parallel with the main chain at a connection node A (referring to FIG. 7, a node A in the main chain formed by components 1, 2, 3). The LO input positive end LOp and the LO input negative end LOn are connected with the LO circuit 6, and configured to receive the signals with fixed or variable LO frequencies provided by the LO circuit 6.

Figure 5B:
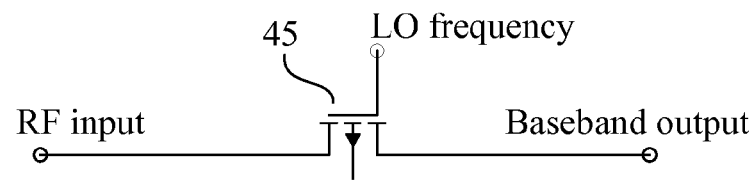
FIG. 5b is a schematic structural view of a single-end passive mixing circuit according to an embodiment of the present invention.

FIG. 5b is a schematic structural view of a single-end passive mixing circuit according to an embodiment of the present invention. As shown in FIG. 5b, the single-end passive mixing circuit of this embodiment includes a field effect transistor (FET) 45 having a source being an RF input. A drain of the FET 45 is a baseband output, and is configured to serve as a single-end input for the frequency selective circuit realized by impedance difference connected to the single-end passive mixing circuit. A gate of the FET 45 is a LO frequency input end.

Figure 6A:
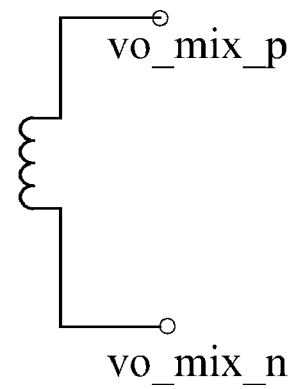
FIG. 6a is a schematic structural view of a first frequency selective circuit realized by impedance difference according to an embodiment of the present invention.
Figure 6B:
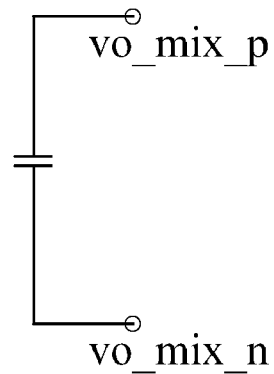
FIG. 6b is a schematic structural view of a second frequency selective circuit realized by impedance difference according to an embodiment of the present invention.
Figure 6C:
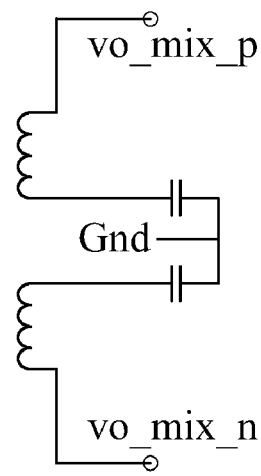
FIG. 6c is a schematic structural view of a third frequency selective circuit realized by impedance difference according to an embodiment of the present invention.
Figure 6D:
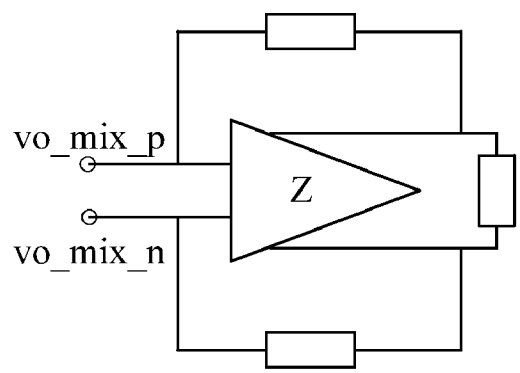
FIG. 6d is a schematic structural view of a fourth frequency selective circuit realized by impedance difference according to an embodiment of the present invention.

FIG. 6a is a schematic structural view of a first frequency selective circuit realized by impedance difference according to an embodiment of the present invention. As shown in FIG. 6, the frequency selective circuit realized by impedance difference has a structure of connecting an inductor in parallel to the ground (or virtual ground in the differential circuit). FIG. 6b is a schematic structural view of a second frequency selective circuit realized by impedance difference according to an embodiment of the present invention. As shown in FIG. 6b, the frequency selective circuit realized by impedance difference has a structure of connecting a capacitor in parallel to the ground. FIG. 6c is a schematic structural view of a third frequency selective circuit realized by impedance difference according to an embodiment of the present invention. As shown in 6c, the frequency selective circuit realized by impedance difference has a structure of connecting a low-frequency resonant network in parallel to the ground. FIG. 6d is a schematic structural view of a fourth frequency selective circuit realized by impedance difference according to an embodiment of the present invention. As shown in 6d, a vo_mix_p end of the frequency selective circuit realized by impedance difference is connected with the baseband differential output positive end BBoutp, and a vo_mix_n end of the frequency selective circuit realized by impedance difference is connected with the baseband differential output negative end BBoutn, a resistor parallels with the passive mixing circuit, a resistor is disposed between the resistor connected in parallel with the passive mixing circuit and the vo_mix_p end of the frequency selective circuit realized by impedance difference and a resistor is disposed between the resistor connected in parallel with the passive mixing circuit and the vo_mix_n end of the frequency selective circuit realized by impedance difference. The frequency selective circuits shown in FIGS. 6a-6d have a structure of a low inband impedance transimpedance circuit, or other structures capable of completing the function of frequency selection by impedance difference. Regardless of which structure is adapted, in case of differential connection, the frequency selective circuit realized by impedance difference is connected to the baseband output end of the passive mixing circuit. Specifically, in case of dual-end connection, the vo_mix_p end of the frequency selective circuit realized by impedance difference is connected with the baseband differential output positive end BBoutp of the passive mixing circuit, and the vo_mix_n end of the frequency selective circuit realized by impedance difference is connected with the baseband differential output negative end BBoutn of the passive mixing circuit; and in case of single-end connection, for example, connection with the single-end passive mixing circuit in FIG. 5b, the frequency selective circuit realized by impedance difference only needs to be connected with the baseband output end of the passive mixing circuit. According to the present invention, through connecting the mixing circuit to the RF chip main chain, signals in the main chain that need to be suppressed (for example, interference or transmit signal leakage) are introduced into the frequency selective circuit realized by impedance difference through the mixing circuit, thus achieving the purpose of filtering out interference signals of the RF chip. Compared with the prior art, the equivalent RF notch filter of the present embodiment has the advantages of low noise introduced and low cost.

The equivalent RF notch filter of the present invention may be connected to the main chain of the RF chip or other nodes with relative high-impedance of the RF link circuit. Through changing the LO frequency of the LO circuit and the parameters of frequency selective network of the frequency selective circuit realized by impedance difference, flexible suppression of different frequencies is realized.

Figure 7:
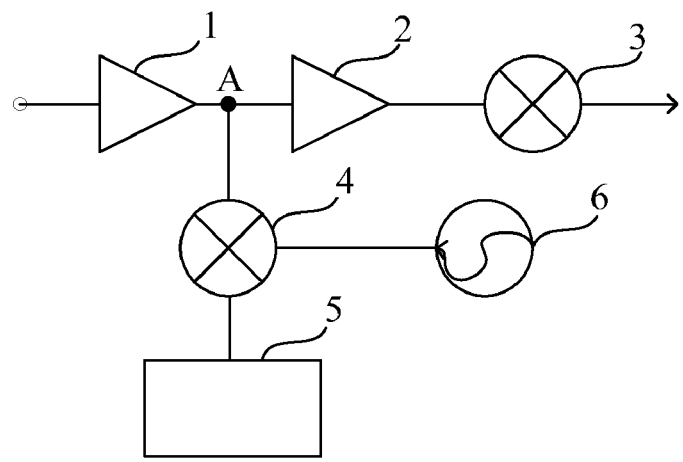
FIG. 7 is a schematic structural view of an RF chip according to an embodiment of the present invention.

FIG. 7 is a schematic structural view of an RF chip according to an embodiment of the present invention. The RF chip of this embodiment includes, for example, two LNAs, specifically, a first-stage LNA1, that is, an amplifier 1, a second-stage LNA2, that is, an amplifier 2, and a mixer 3. The amplifier 1 and the amplifier 2 are in connection and the amplifier 2 is connected with the mixer 3. The amplifier 1, the amplifier 2, and the mixer 3 form a main chain of the RF path, that is, the main chain of the RF chip. This embodiment further includes an equivalent RF notch filter, and the equivalent RF notch filter includes a mixing circuit 4, a frequency selective circuit realized by impedance difference 5 connected with the mixing circuit 4, and a LO circuit 6 connected with the mixing circuit 4. The LO circuit 6 is configured to provide a LO frequency signal for the mixing circuit 4. The mixing circuit 4 has an input end connected in parallel with the main chain, and down-converts interference signals of the main chain, including in-band and out-band interference or transmitter leakage that needs to be suppressed and main receiver frequency bands, and output the down-converted signals to the frequency selective circuit realized by impedance difference 5 according to the LO frequency signal provided by the LO circuit. The frequency selective circuit realized by impedance difference 5 is configured to provide different impedances for different frequencies, for example, lower impedance for lower frequency component, and higher impedance for higher frequency component. The frequency selective circuit realized by impedance difference 5 receives signals of various frequencies after frequency conversion from the mixing circuit 4. According to the difference between the interference signal frequency and the main signal frequency, the interference signal and the main signal are down-converted and mapped to a low-impedance region and a high-impedance region respectively. The mixing circuit 4, the frequency selective circuit realized by impedance difference 5, and the LO circuit 6 form an equivalent RF notch filter of the RF chip. In this embodiment, a connection node A of the equivalent RF notch filter and the main chain is disposed behind the LNA1, and specifically, located between the LNA1 and the LNA2. In fact, the connection node A may also locate behind the LNA2, that is, between the amplifier 2 and the mixer 3, or is connected in parallel to the high-impedance node in front of the mixer in the main chain.

For structures and functions of the passive mixing circuit and the frequency selective circuit realized by impedance difference in the RF chip of this embodiment, reference can be made to the description in the embodiment of the equivalent RF notch filter.

In this embodiment, the LO frequency of the LO circuit 6, the size of the MOS transistor of the mixing circuit 4 and the parameters of frequency selective network of the frequency selective circuit realized by impedance difference 5 can be set or selected according to actual needs, such that the impedance for interference frequencies that need to be suppressed is much smaller than impedance for the signal frequencies. After passing through the LNA1, the interference or transmitter leakage that needs to be suppressed meets the connection node A, and will not transfer along the main chain, but is leaked to the mixing circuit 4, and then is down-converted to an auxiliary circuit part of the low-impedance region of the frequency selective circuit realized by impedance difference 5.

After passing through the LNA1 of the main chain, the main receiver frequency bands meet the connection node A, and from the view of the connection node A, the impedance of an auxiliary branch circuit for the frequencies of signals of main receive chain is a high impedance, and the energy of the signals of main receive chain will continuously transfer towards a post circuit of the main chain. From the view of the connection node A where the auxiliary branch circuit is introduced, the interference or transmitter leakage that needs to be suppressed has a low impedance in the auxiliary branch circuit and a high impedance in the main chain. The main signal has high impedance in the auxiliary branch circuit and low impedance in the main chain. A ratio of the impedance for the signal frequency band to the impedance for the interference or transmitter leakage frequency band is the interference or transmitter leakage suppression capability of the circuit, which is deduced as follows.

It is assumed that a source impedance of the main chain (such as, the LNA1) at the connection node A is Rs, a load impedance of the LNA1 in the main chain is Rm, an impedance for interference or the transmitter leakage frequency band in the auxiliary branch circuit is Raux_n, and an impedance for signal frequency band in the auxiliary branch circuit is Raux_s, then a total impedance Rn_tot for the interference or transmitter leakage frequency is:
Rn_tot=Rs//Rm//Raux_n; a total impedance Rs tot for the signal frequency is:
Rs_tot=Rs//Rm//Raux_s;
the suppression Nsup (dB) is:
Nsup (dB)=20×log (Rs_tot/Rn_tot).

A reasonable value is set, for example, Rs is 500 ohms, Rm is 800 ohms, Raux_s is 800 ohms, Raux_n is 80 ohms, then the suppression of the auxiliary branch circuit on the interference or transmitter leakage is:

Nsup (dB)=20* log [(500//800//800)/
(500//800//80)]=10.88 dB.

Figure 8:
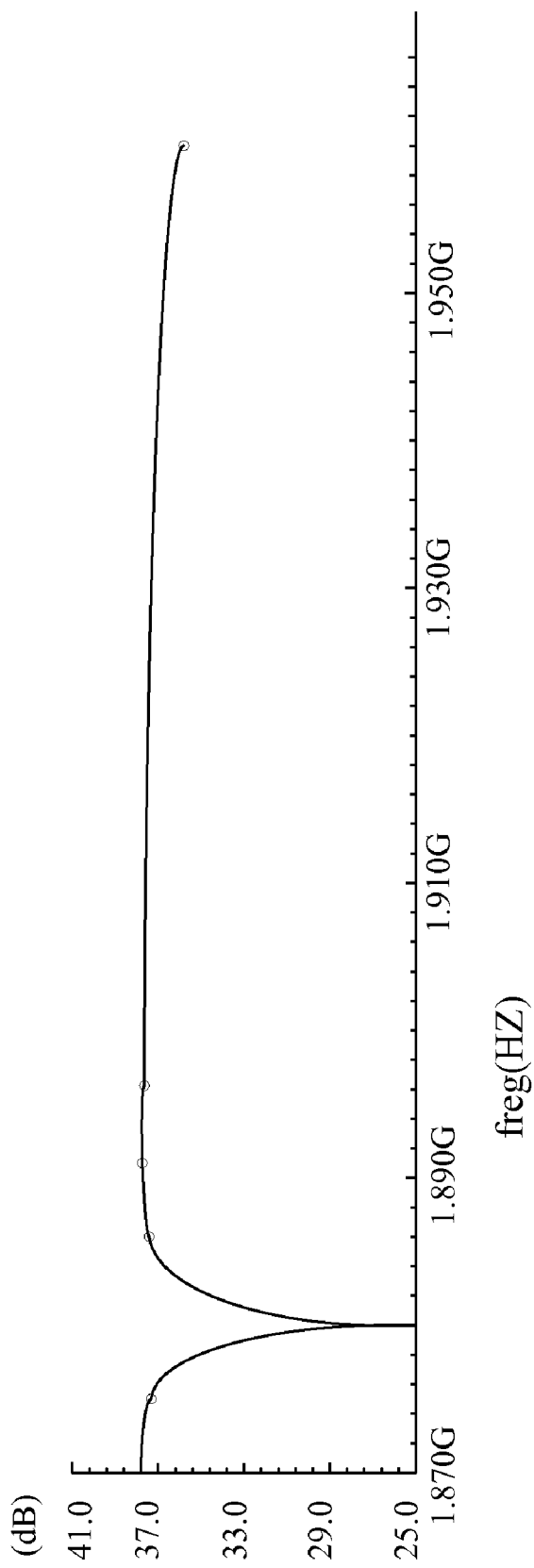
FIG. 8 is a simulation diagram of suppressing "TX" leakage by a "WCDMA BANDII" terminal receiver according to an embodiment of the present invention.

FIG. 8 is a simulation diagram of suppressing "TX" leakage by a "WCDMA BANDII" terminal receiver according to an embodiment of the present invention. As shown in FIG. 8, in this embodiment, the suppression of the "WCDMA BANDII" terminal receiver on the "TX" leakage is simulated, and the simulation results show that, the suppression of the circuit of this embodiment on the TX leakage is superior to 10 dB; and the suppression can be further improved through optimizing the impedance characteristic of the auxiliary branch circuit. Systematic analysis indicates that, when the suppression is higher than 10 dB, the SAW filter between the LNA and the mixer in the WCDMA BANDII terminal equipment may be omitted, thus small size, single chip, and low power consumption of the receiver are realized.

Furthermore, when no interference exists or the interference is low, and it is unnecessary to suppress the interference, the equivalent RF notch filter may be closed, so as to eliminate unnecessary power consumption of the components.

In the embodiment of the present invention, an equivalent RF notch filter is used in an RF IC to filter out interferences, thus achieving the purpose of removing a SAW filter between a LNA and a mixer in a conventional FDD wireless receiver. Moreover, the cost of the wireless terminal equipment and wireless base station equipment is reduced, and the requirements of single chip of multi-mode and multi-frequency band are met, such that the wireless terminal equipment and the wireless base station equipment meet the requirements on small size. An equivalent RF notch filter is used in a wireless communication receiver to filter out interferences, and thus the requirements on the linearity of the receiver are reduced, such that the small size and low power consumption of communication equipment are realized. Furthermore, because it is easier for the frequency selectivity to realize narrow band at low frequency than at high frequency, compared with the prior art, the auxiliary mixing circuit of this embodiment has high capability of filtering out interferences close to the main receiver frequency band signal, and the introduced noise is low. The simulation results show that, when being connected behind the LNA, the noise contribution to the main chain of the auxiliary branch circuit is lower than 0.1 dB. Compared with the third prior art, the suppression on interferences and transmitter leakage of the auxiliary branch circuit of this embodiment is still higher than 10 dB without controlling the group delay of LPF.

Figure 9:
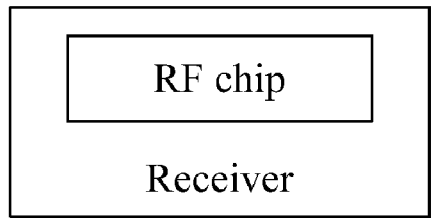
FIG. 9 is a schematic structural view of a receiver according to an embodiment of the present invention.

FIG. 9 is a schematic structural view of a receiver according to an embodiment of the present invention. The receiver of this embodiment includes an RF chip of the previous embodiment, of which an equivalent RF notch filter part is capable of effectively filtering out interferences, and thus the requirements on the linearity of the receiver is reduced, such that small size and low power consumption of communication equipment are realized. Definitely, the receiver of this embodiment includes an RF chip and a main chain including at least one LNA and a mixer. The RF chip may not include the main chain including an LNA and a mixer, and in this embodiment, only includes an equivalent RF notch filter. For example, the RF chip includes a LO circuit, a mixing circuit, and a frequency selective circuit realized by impedance difference. The LO circuit is configured to provide a LO frequency signal. The mixing circuit has an input end electrically connected with the main chain of the RF circuit, parallels with the main chain, and configured to down-convert the signals of the main chain that need to be suppressed according to the LO frequency signal provided by the LO circuit, and output down-converted signals. The frequency selective circuit realized by impedance difference is connected to a baseband output end of the mixing circuit, and is configured to provide different impedances for down-converted signals with different frequencies from the mixing circuit, so as to absorb the signals that need to be suppressed. Similarly, the receiver may also introduce the signals in the main chain that need to be suppressed (for example, interference or transmit signal leakage) into the frequency selective circuit realized by impedance difference through the mixing circuit, so as to achieve the purpose of filtering out the interference signals of the RF chip. Compared with the prior art, the receiver of this embodiment has the advantages of low noise introduced and low cost.

Finally, it should be noted that the above embodiments are merely provided for describing the technical solutions of the present invention, but not intended to limit the present invention. It should be understood by persons of ordinary skill in the art that although the present invention has been described in detail with reference to the embodiments, modifications can be made to the technical solutions described in the embodiments, or equivalent replacements can be made to some technical features in the technical solutions, as long as such modifications or replacements do not depart from the spirit and scope of the present invention.

What is claimed is:

1. An equivalent radio frequency (RF) notch filter, configured to absorb a signal to be suppressed, comprising:
    a local oscillation (LO) circuit, configured to provide a LO frequency signal;
    a mixing circuit, having an input end electrically connected to a main chain of an RF circuit, configured to be connected in parallel with the main chain, down-convert the signal to be suppressed according to the LO frequency signal, and output a down-converted signal; and
    a frequency selective circuit realized by impedance difference, connected to a baseband output end of the mixing circuit, and configured to provide different impedances for down-converted signals with different frequencies from the mixing circuit.

2. The equivalent RF notch filter according to claim 1, wherein the mixing circuit is a differential passive mixing circuit, the frequency selective circuit realized by impedance difference has differential input, and the differential passive mixing circuit comprises four field effect transistors (FETs); and
    wherein a source of a first FET is connected with a source of a second FET at a connection point being an RF differential input positive end, a source of a third FET is connected with a source of a fourth FET at a connection point being an RF differential input negative end, a drain of the first FET is connected with a drain of the third FET at a connection point being a baseband differential output positive end, a drain of the second FET is connected with a drain of the fourth FET at a connection point being a baseband differential output negative end, gates of the first FET and the fourth FET are an input positive end of the LO circuit, and gates of the second FET and the third FET are an input negative end of the LO circuit.

3. The equivalent RF notch filter according to claim 1, wherein the mixing circuit is a single-end passive mixing circuit, the frequency selective circuit realized by impedance difference has a single-end input, and the single-end passive mixing circuit comprises an FET, wherein the FET has a source being an RF input, a drain being the baseband output end of the mixing circuit, and a gate being a LO frequency input end.

4. The equivalent RF notch filter according to claim 1, wherein the mixing circuit is connected in parallel between a first low noise amplifier (LNA) and a mixer in the main chain.

5. The equivalent RF notch filter according to claim 1, wherein the mixing circuit is connected in parallel between a first LNA and a second LNA in the main chain.

6. The equivalent RF notch filter according to claim 1, wherein the mixing circuit is connected in parallel with a high-impedance node in front of the mixer in the main chain.

7. The equivalent RF notch filter according to claim 1, wherein the frequency selective circuit realized by impedance difference has a structure of connecting an inductor in parallel to the ground;
    when the mixing circuit is a differential passive mixing circuit, two ends of the inductor are connected with the baseband output end of the mixing circuit; and
    when the mixing circuit is a single-end passive mixing circuit, one end of the inductor is connected with the baseband output end of the mixing circuit, and the other end of the inductor is connected to the ground.

8. The equivalent RF notch filter according to claim 1, wherein the frequency selective circuit realized by impedance difference has a structure of connecting a capacitor in parallel to the ground;
    when the mixing circuit is a differential passive mixing circuit, two ends of the capacitor are connected with the baseband output end of the mixing circuit; and
    when the mixing circuit is a single-end passive mixing circuit, one end of the capacitor is connected with the baseband output end of the mixing circuit, and the other end of the capacitor is connected to the ground.

9. The equivalent RF notch filter according to claim 1, wherein the frequency selective circuit realized by impedance difference has a structure of connecting a low-frequency resonant network in parallel to the ground;
    when the mixing circuit is a differential passive mixing circuit, two ends of the resonant network are connected with the baseband output end of the mixing circuit; and
    when the mixing circuit is a single-end passive mixing circuit, one end of the resonant network is connected with the baseband output end of the mixing circuit, and the other end of the resonant network is connected to the ground.

10. The equivalent RF notch filter according to claim 1, wherein the frequency selective circuit realized by impedance difference is a low inband impedance trans-impedance circuit;
    when the mixing circuit is a differential passive mixing circuit, the low inband impedance trans-impedance circuit is a differential circuit, and
    when the mixing circuit is a single-end passive mixing circuit, the low inband impedancetrans-impedance circuit is a single-end circuit.

11. The equivalent RF notch filter according to claim 1, wherein the frequency selective circuit realized by impedance difference parallels with the baseband output end of the mixing circuit and the mixing circuit is a passive mixing circuit.

12. A radio frequency (RF) chip, comprising a main chain including at least one low noise amplifier (LNA) and a mixer, and further comprising an equivalent RF notch filter, wherein the equivalent RF notch filter comprises:
    a local oscillation (LO) circuit, configured to provide a LO frequency signal;
    a mixing circuit, having an input end electrically connected to the main chain, configured to be connected in parallel with the main chain, down-convert a signal that need to be suppressed according to the LO frequency signal, and output a down-converted signal; and
    a frequency selective circuit realized by impedance difference, connected to a baseband output end of the mixing circuit, and configured to provide different impedances for down-converted signals with different frequencies from the mixing circuit.

13. The RF chip according to claim 12, wherein the mixing circuit is a differential passive mixing circuit, the frequency selective circuit realized by impedance difference has differential input, and the differential passive mixing circuit comprises four field effect transistors (FETs); and wherein a source of a first FET is connected with a source of a second FET at a connection point being an RF differential input positive end, a source of a third FET is connected with a source of a fourth FET at a connection point being an RF differential input negative end, a drain of the first FET is connected with a drain of the third FET at a connection point being a baseband differential output positive end, a drain of the second FET is connected with a drain of the fourth FET at a connection point being a baseband differential output negative end, gates of the first FET and the fourth FET are an input positive end of the LO circuit, and gates of the second FET and the third FET are an input negative end of the LO circuit.

14. The RF chip according to claim 12, wherein the mixing circuit is a single-end passive mixing circuit, and the frequency selective circuit realized by impedance difference has a single-end input, and the single-end passive mixing circuit comprise a FET, wherein the FET has a source being an RF input, a drain being the baseband output end of the mixing circuit and a gate being a LO frequency input end.

15. The RF chip according to claim 12, wherein the frequency selective circuit realized by impedance difference has a structure of connecting an inductor in parallel to the ground;
when the mixing circuit is a differential passive mixing circuit, two ends of the inductor are connected with the baseband output end of the mixing circuit; and
when the mixing circuit is a single-end passive mixing circuit, one end of the inductor is connected to the the baseband output end of the mixing circuit, and the other end of the inductor is connected to the ground.

16. The RF chip according to claim 12, wherein the frequency selective circuit realized by impedance difference has a structure of connecting a capacitor in parallel to the ground;
when the mixing circuit is a differential passive mixing circuit, two ends of the capacitor are connected with the baseband output end of the mixing circuit; and
when the mixing circuit is a single-end passive mixing circuit, one end of the capacitor is connected with the baseband output end of the mixing circuit, and the other end of the capacitor is connected to the ground.

17. The RF chip according to claim 12, wherein the frequency selective circuit realized by impedance difference has a structure of connecting a low-frequency resonant network in parallel to the ground;
when the mixing circuit is a differential passive mixing circuit, two ends of the resonant network are connected with the baseband output end of the mixing circuit; and
when the mixing circuit is a single-end passive mixing circuit, one end of the resonant network is connected with the baseband output end of the mixing circuit, and the other end of the resonant network is connected to the ground.

18. The RF chip according to claim 12, wherein the frequency selective circuit realized by impedance difference is a low inband impedance trans-impedance circuit;
when the mixing circuit is a differential passive mixing circuit, the low inband impedance trans-impedance circuit is a differential circuit, and
when the mixing circuit is a single-end passive mixing circuit, the low inband impedance trans-impedance circuit is a single-end circuit.

19. A receiver, comprising a radio frequency (RF) chip and a main chain including at least one low noise amplifier (LNA) and a mixer, wherein the RF chip comprises:
a local oscillation (LO) circuit, configured to provide a LO frequency signal;
a mixing circuit, having an input end electrically connected to the main chain, configured to be connected in parallel with the main chain, and down-convert a signal of that need to be suppressed according to the LO frequency signal, and output a down-converted signal; and
a frequency selective circuit realized by impedance difference, connected to a baseband output end of the mixing circuit, and configured to provide different impedances for down-converted signals with different frequencies from the mixing circuit.

20. The receiver according to claim 19, wherein the mixing circuit is a differential passive mixing circuit, and the frequency selective circuit realized by impedance difference connected to the differential passive mixing circuit has differential input, and the differential passive mixing circuit comprises four field effect transistors (FETs); and
wherein a source of a first FET is connected with a source of a second FET at a connection point being an RF differential input positive end, a source of a third FET is connected with a source of a fourth FET at a connection point being an RF differential input negative end, a drain of the first FET is connected with a drain of the third FET at a connection point being a baseband differential output positive end, a drain of the second FET is connected with a drain of the fourth FET at a connection point being a baseband differential output negative end, gates of the first FET and the fourth FET are an input positive end of the LO circuit, and gates of the second FET and the third FET are an input negative end of the LO circuit.

* * * * *

UNITED STATES PATENT AND TRADEMARK OFFICE
CERTIFICATE OF CORRECTION

PATENT NO.           : 8,385,873 B2  
APPLICATION NO.      : 13/118270  
DATED                : February 26, 2013  
INVENTOR(S)          : Jianjun Zhou et al.

Page 1 of 1

It is certified that error appears in the above-identified patent and that said Letters Patent is hereby corrected as shown below:

In the Claims:

Column 10 Line 35 - Claim 10 should read as follows:

10. The equivalent RF notch filter, according to claim 1, wherein the frequency selective circuit realized by impedance difference is a low band impedance trans-impedance circuit;
when the mixing circuit is a differential passive mixing circuit, the low inband impedance trans-impedance circuit is a differential circuit, and
when the mixing circuit is a single-end passive mixing circuit, the low inband impedance trans-impedance circuit is a single-end circuit.

Column 11 Line 23 - Claim 15 should read as follows:

15. The RF chip according to claim 12, wherein the frequency selective circuit realized by impedance difference has a structure of connecting an inductor in parallel to the ground;
when the mixing circuit is a differential passive mixing circuit, two ends of the inductor are connected with the baseband output end of the mixing circuit; and
when the mixing circuit is a single-end passive mixing circuit, one end of the inductor is connected to the baseband output end of the mixing circuit, and the other end of the inductor is connected to the ground.

Signed and Sealed this  
Thirtieth Day of April, 2013

Teresa Stanek Rea  
*Acting Director of the United States Patent and Trademark Office*